US012595555B2

(12) United States Patent
Illiberi et al.

(10) Patent No.: US 12,595,555 B2
(45) Date of Patent: *Apr. 7, 2026

(54) TOPOSELECTIVE VAPOR DEPOSITION USING AN INHIBITOR

(71) Applicant: ASM IP Holding B.V., Almere (NL)

(72) Inventors: Andrea Illiberi, Leuven (BE); Varun Sharma, Helsinki (FI); Michael Givens, Oud-Heverlee (BE); Marko Tuominen, Helsinki (FI); Shaoren Deng, Ghent (BE)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/891,092

(22) Filed: Sep. 20, 2024

(65) Prior Publication Data
US 2026/0085402 A1 Mar. 26, 2026

Related U.S. Application Data

(63) Continuation of application No. 17/457,764, filed on Dec. 6, 2021, now Pat. No. 12,136,552.

(60) Provisional application No. 63/123,136, filed on Dec. 9, 2020.

(51) Int. Cl.
*C23C 16/04* (2006.01)

(52) U.S. Cl.
CPC .................................. *C23C 16/045* (2013.01)

(58) Field of Classification Search
None
See application file for complete search history.

(56) References Cited

U.S. PATENT DOCUMENTS

| | | | |
|---|---|---|---|
| 9,112,003 | B2 | 8/2015 | Haukka et al. |
| 9,490,145 | B2 | 11/2016 | Niskanen et al. |
| 9,803,277 | B1 | 10/2017 | Longrie et al. |
| 9,805,974 | B1 | 10/2017 | Chen et al. |
| 9,895,715 | B2 | 2/2018 | Haukka et al. |
| 10,014,212 | B2 | 7/2018 | Chen et al. |
| 10,047,435 | B2 | 8/2018 | Haukka et al. |
| 10,121,699 | B2 | 11/2018 | Wang et al. |
| 10,343,186 | B2 | 7/2019 | Pore et al. |
| 10,373,820 | B2 | 8/2019 | Tois et al. |
| 10,428,421 | B2 | 10/2019 | Haukka et al. |
| 10,453,701 | B2 | 10/2019 | Tois et al. |
| 10,566,185 | B2 | 2/2020 | Wang et al. |

(Continued)

FOREIGN PATENT DOCUMENTS

| | | |
|---|---|---|
| JP | H08-222569 A | 8/1996 |
| KR | 10-2020-0011898 A | 2/2020 |
| KR | 10-2020-0038425 A | 4/2020 |

*Primary Examiner* — Shamim Ahmed
*Assistant Examiner* — Bradford M Gates
(74) *Attorney, Agent, or Firm* — Banner & Witcoff, Ltd.

(57) ABSTRACT

The current disclosure generally relates to the manufacture of semiconductor devices. Specifically, the disclosure relates to methods of depositing a layer on a substrate comprising a recess. The method comprises providing the substrate comprising a recess in a reaction chamber, depositing inhibition material on the substrate to fill the recess with inhibition material, removing the inhibition material from the substrate for exposing a deposition area and depositing a layer on the deposition area by a vapor deposition process. A vapor deposition assembly for performing the method is also disclosed.

20 Claims, 4 Drawing Sheets

(56) References Cited

U.S. PATENT DOCUMENTS

| | | | |
|---|---|---|---|
| 10,695,794 | B2 | 6/2020 | Pore et al. |
| 10,872,765 | B2 | 12/2020 | Tois et al. |
| 10,900,120 | B2 | 1/2021 | Sharma et al. |
| 11,081,342 | B2 | 8/2021 | Farm et al. |
| 11,094,535 | B2 | 8/2021 | Tois et al. |
| 11,139,163 | B2 | 10/2021 | Maes et al. |
| 11,145,506 | B2 | 10/2021 | Maes et al. |
| 11,170,993 | B2 | 11/2021 | Tois et al. |
| 12,136,552 | B2 * | 11/2024 | Illiberi .................. C23C 16/045 |
| 2017/0365513 | A1 | 12/2017 | Yang et al. |
| 2018/0151345 | A1 | 5/2018 | Haukka et al. |
| 2018/0323055 | A1 | 11/2018 | Woodruff et al. |
| 2018/0350587 | A1 | 12/2018 | Jia et al. |
| 2020/0035501 | A1 | 1/2020 | Tabata et al. |
| 2020/0105515 | A1 | 4/2020 | Maes et al. |
| 2020/0325573 | A1 | 10/2020 | Illiberi et al. |
| 2021/0301392 | A1 | 9/2021 | Illiberi et al. |
| 2021/0395888 | A1 | 12/2021 | Cho et al. |

* cited by examiner

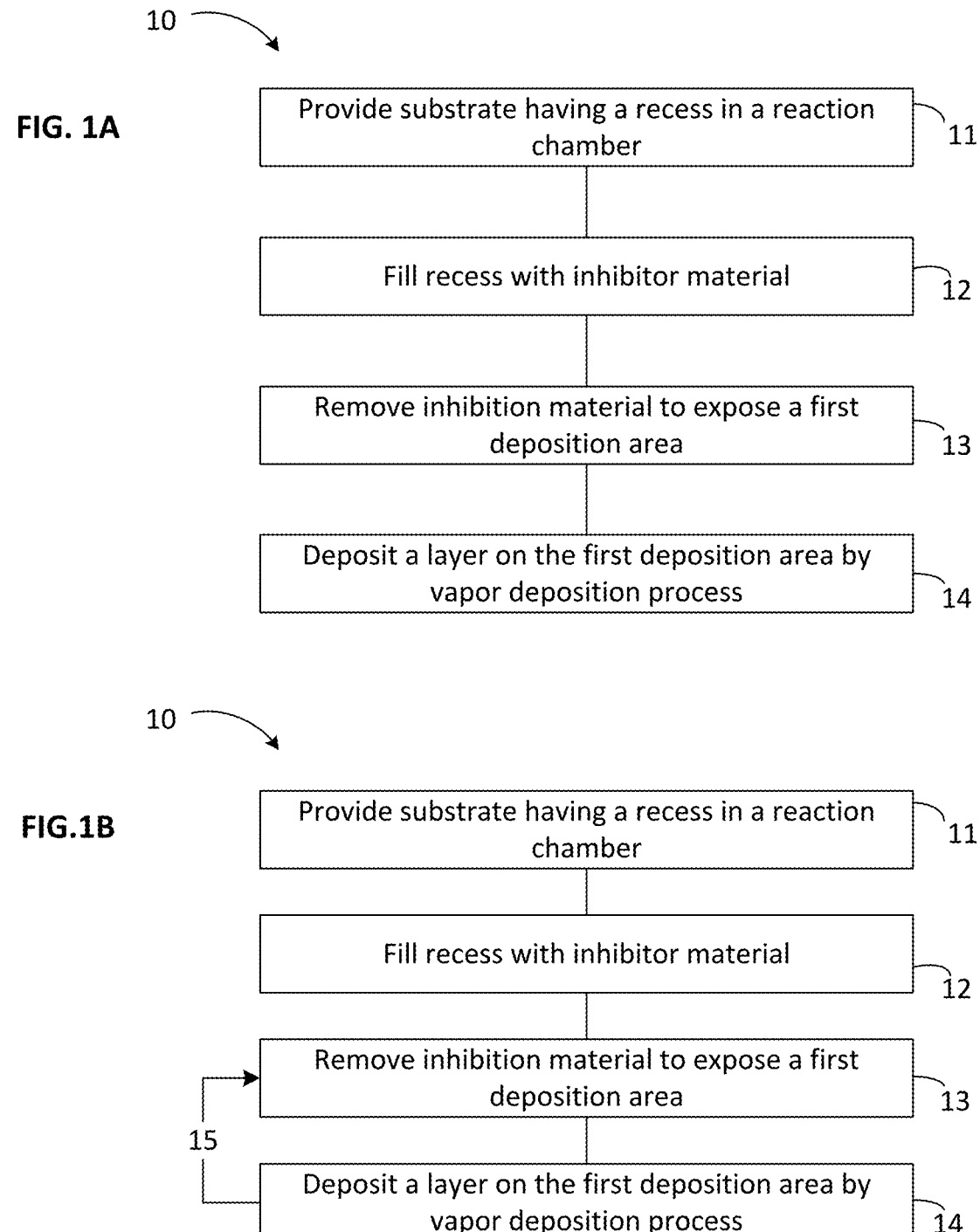

Provide substrate having a recess in a reaction chamber   11

Fill recess with inhibitor material   12

Remove inhibition material to expose a first deposition area   13

Deposit a layer on the first deposition area by vapor deposition process   14

Provide substrate having a recess in a reaction chamber   11

Fill recess with inhibitor material   12

Remove inhibition material to expose a first deposition area   13

15

Deposit a layer on the first deposition area by vapor deposition process   14

FIG.2A
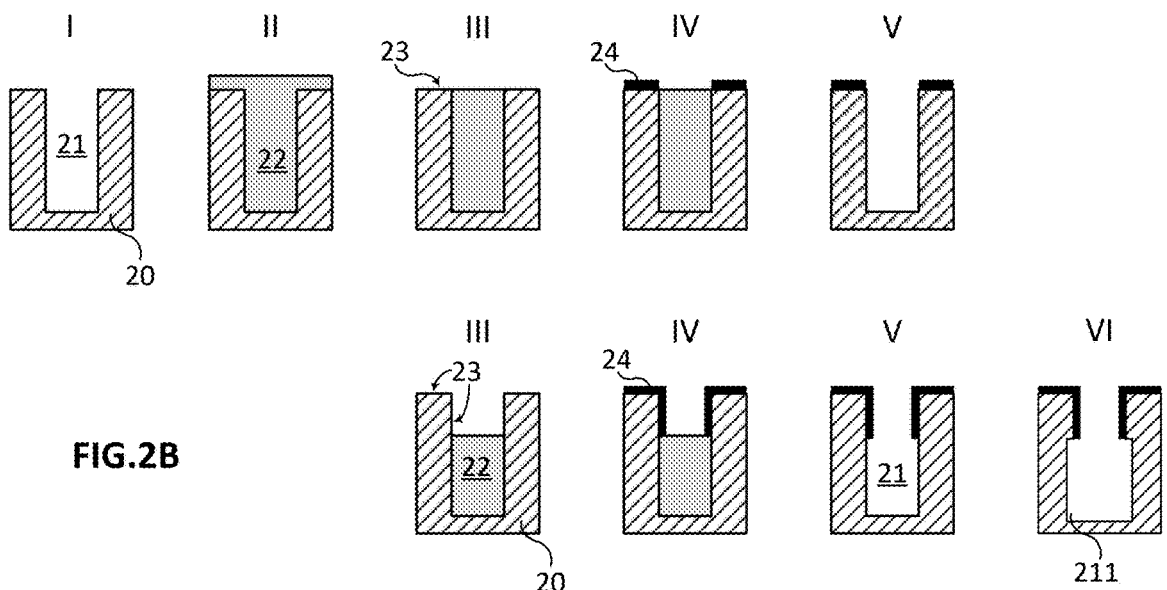
FIG.2B
FIG.2C
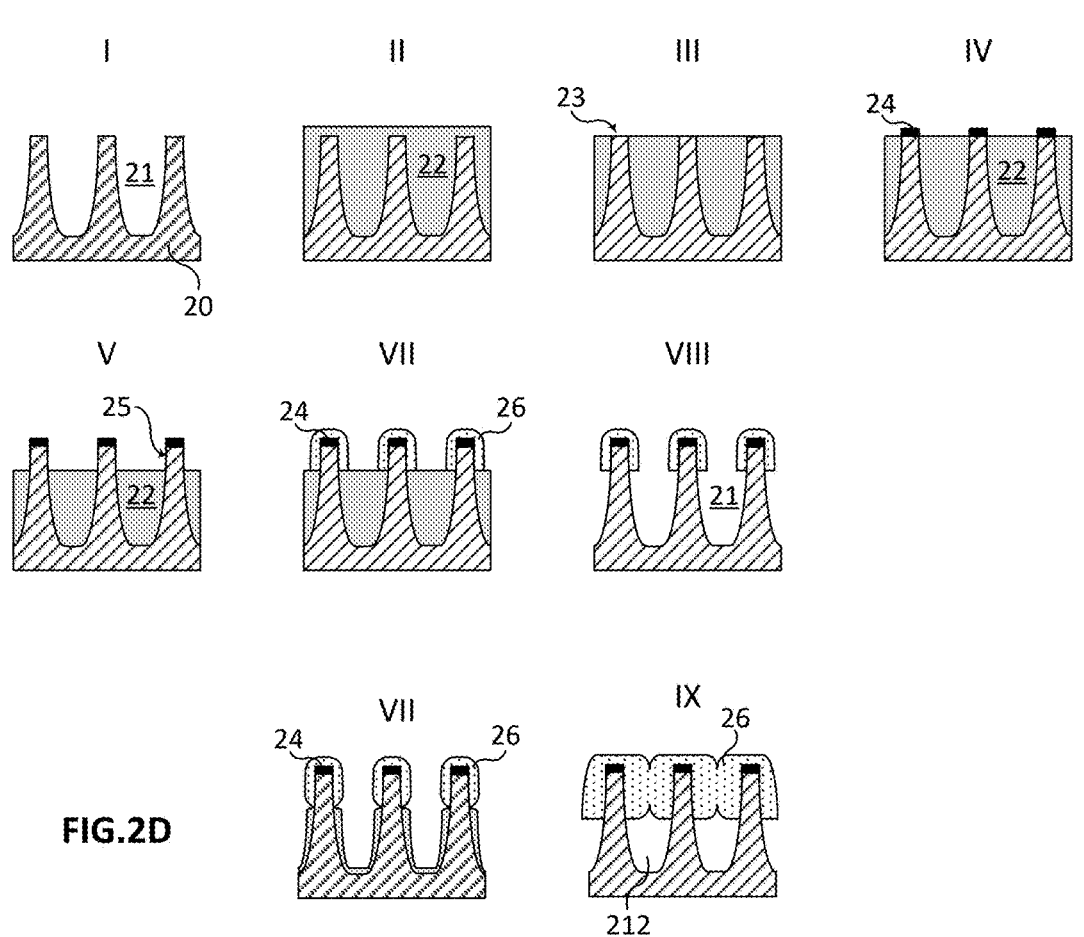
FIG.2D

TOPOSELECTIVE VAPOR DEPOSITION USING AN INHIBITOR

CROSS REFERENCE TO PRIORITY APPLICATION

This application is a continuation of U.S. patent application Ser. No. 17/457,764, filed Dec. 6, 2021, titled "TOPOSELECTIVE VAPOR DEPOSITION USING AN INHIBITOR", which claims the benefit of priority of U.S. Provisional Patent Application No. 63/123,136, filed Dec. 9, 2020, and titled "TOPOSELECTIVE VAPOR DEPOSITION USING AN INHIBITOR." The disclosures of the priority applications identified above are hereby incorporated by reference in their entirety for all purposes.

FIELD

The present disclosure relates to methods and apparatuses for the manufacture of semiconductor devices. More particularly, the disclosure relates to methods and systems for depositing a layer or a thin film on a substrate comprising a recess.

BACKGROUND

The shrinking device dimensions in semiconductor manufacturing call for new innovative processing approaches. Films or layers of material are deposited on a surface of a substrate during manufacturing of electronic devices, such as integrated circuits. During the manufacturing process, recesses, such as trenches or spaces between elevated portions, such as fins, may be formed. The ability to accurately deposit various layers in different parts of such structures is important in continuing to reduce the size, and improve the performance of semiconductor devices.

However, there is a need in the art for more versatile deposition schemes to deposit material layers in different vertical areas of semiconductor structures.

SUMMARY

Polymer thin films can be used, for example, as a starting point in semiconductor applications for amorphous carbon films or layers. Vapor phase deposition processes such as chemical vapor deposition (CVD), vapor deposition polymerization (VDP), molecular layer deposition (MLD), and sequential deposition processes such as atomic layer deposition (ALD) and cyclical CVD have been applied to the formation of polymer thin films. Organic films have been used to achieve selectivity between two different materials in planar semiconductor applications.

In the current disclosure, organic material is used to fill a recess in order to differentiate between different areas of the recess, and to obtain selective deposition over a specific substrate area inside or outside the recess.

In a first aspect, a method of depositing a layer on a substrate comprising a recess is disclosed. The method comprises providing the substrate comprising a recess in a reaction chamber, depositing inhibition material on the substrate to fill the recess, removing a part of the inhibition material from the substrate for exposing a first deposition area and depositing a layer on the first deposition area by a selective vapor deposition process.

In a second aspect, another method of deposition of a layer on a substrate comprising a recess is disclosed. This method comprises providing the substrate with the recess in a reaction chamber, wherein a surface of the recess comprises an area with inhibition material, removing the inhibition material to a predetermined degree for exposing a first deposition area, and depositing a layer on the first deposition area by a selective vapor deposition process.

In a third aspect, a vapor deposition assembly for depositing a layer on a substrate comprising a recess is disclosed. The assembly comprises a first reaction chamber configured and arranged to deposit an inhibition material on the substrate for filling the recess, and to remove the inhibition material from the substrate for exposing a first deposition area; and a second reaction chamber configured and arranged to deposit a layer on the first deposition area by a selective vapor deposition process.

In a fourth aspect, vapor deposition assembly for depositing a layer on a substrate comprising a recess is disclosed. The assembly comprises one or more reaction chambers constructed and arranged to hold a substrate comprising a recess. The assembly further comprises one or more inhibition material precursor vessels constructed and arranged to contain and evaporate an inhibition material precursor to form an inhibition material precursor vapor, one or more reactant vessels constructed and arranged to contain and evaporate a reactant to form a reactant vapor and a precursor injector system constructed and arranged to provide the inhibition material precursor, and the reactant into a reaction chamber in a vapor phase. The assembly further comprises an inhibition material removal system configured and arranged to remove the inhibition material from the substrate for exposing a first deposition area. The assembly is further constructed and arranged to provide the inhibition material precursor via the precursor injector system to the reaction chamber, to remove a part of the inhibition material from the substrate by the inhibition material removal system and to provide the layer precursor via the precursor injector system to the reaction chamber for selectively depositing a layer on the first deposition area of the substrate.

BRIEF DESCRIPTION OF THE DRAWINGS

The accompanying drawings, which are included to provide a further understanding of the disclosure and constitute a part of this specification, illustrate exemplary embodiments and, together with the description, help to explain the principles of the disclosure. In the drawings FIGS. 1A and 1B illustrate an embodiment of a method according to the current disclosure.

FIGS. 2A, 2B, 2C, and 2D illustrate different phases of an embodiment of a method according to the current disclosure.

DETAILED DESCRIPTION

Figure 3:
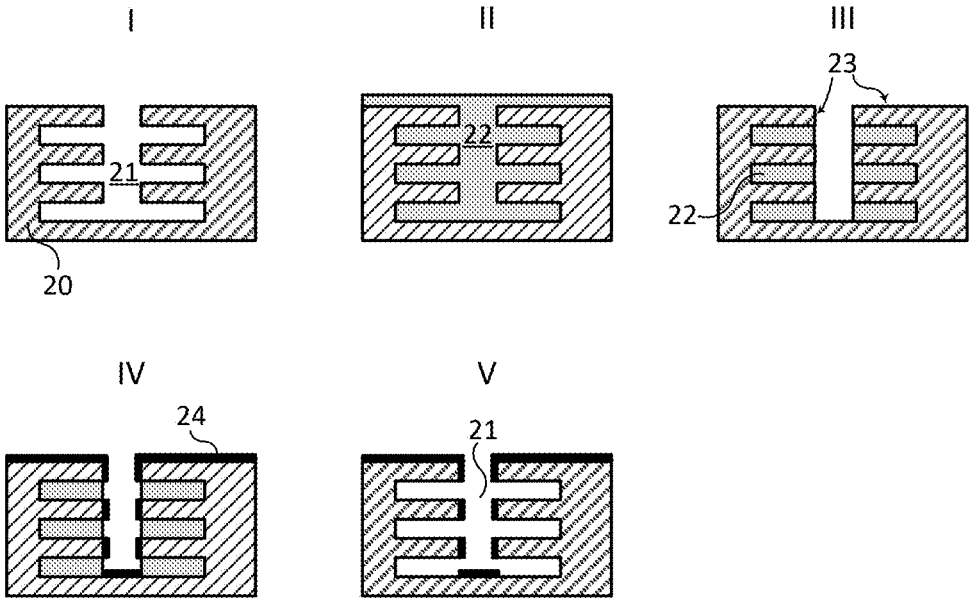
FIG. 3 depicts another embodiment of a deposition method according to the current disclosure.

The substrate according to the current disclosure contains a recess. A recess in this disclosure is in or on a substrate. It is intended to describe changes in the surface topology of the substrate leading to some areas of the substrate surface being lower than other areas. A recess may thus include topologies in which parts of the substrate surface are lower relative to the majority of the substrate surface. The recess may comprise a trench, via, gap, valley, crevice and the like. Further, also areas between elevated features protruding upwards of the majority of the substrate surface form recesses. Thus, the space between adjacent fins or protrusions is considered a recess.

The recess may have tapered or slanting walls, narrowing the diameter of the recess either towards the top or towards the bottom of the recess. The tapering or slanting may cause the recess opening to have larger surface area than the recess bottom. Alternatively, the tapering may cause the recess opening to have smaller surface area than the recess bottom. The recess may comprise a vertical portion and a horizontal portion extending from the vertical portion relative to the substrate surface. In some embodiments, there are two or more horizontal portions extending from a vertical portion. In some embodiments, there are four or more horizontal portions extending from a vertical portion. In some embodiments, there are eight or more horizontal portions extending from a vertical portion. In some embodiments, there are sixteen or more horizontal portions extending from a vertical portion.

In some embodiments, the width of the recess may be from about 3 nm to about 400 nm. For example, the width of the recess may be from about 4 nm to about 300 nm, from about 5 nm to about 100 nm, from about 10 nm to about 50 nm, or about 20 nm. In some embodiments, the width of the recess may be from about 100 nm to about 400 nm, such as about 150 nm, 200 nm, 250 nm, 300 nm or 350 nm. In other embodiments, the width of the recess may be from about 3 nm to about 50 nm, such as from about 3 nm to 10 nm, from about 3 nm to 20 nm, from about 3 nm to about 30 nm, from about 3 nm to about 40 nm. As an example, the width of the recess may be about 4 nm, about 5 nm, about 6 nm, about 8 nm or about 12 nm, about 15 nm, about 18 nm, about 25 nm or about 35 nm.

In some embodiments, the depth of the recess is from about 50 nm to about 7 μm, or about 10 μm. Such etching may take place in one or more, such as two steps. For example, the depth of the recess may be from about 50 nm to about 4 μm, from about 50 nm to about 2 μm, from about 50 nm to about 1 μm, or from about 50 nm to about 500 nm. In additional examples, the depth of recess may be from about 50 nm to about 200 nm, from about 50 nm to about 200 nm, or from about 200 nm to about 7 μm, from about 200 nm to about 5 μm, from about 200 nm to about 3 μm, from about 200 nm to about 1 μm, or from about 200 nm to about 500 nm.

The method 10 of depositing a layer according to the current disclosure comprises providing a substrate with a recess in a reaction chamber in phase 11. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be a single wafer ALD reactor. In some embodiments, the reaction chamber may be a high-volume manufacturing single wafer ALD reactor. In some embodiments, the reaction chamber may be a batch reactor for manufacturing multiple substrates simultaneously.

In some embodiments the processes described herein may be batch processes. Thus, the processes may be carried out on two or more substrates at the same time. In some embodiments the processes described herein may be carried out on two or more, five or more, 10 or more, 25 or more, 50 or more, or 100 or more substrates at the same time. In some embodiments the substrate may comprise wafers, for example, semiconductor or silicon wafers. In some embodiments the substrates may have diameters of 100 mm or more, 200 mm or more, or 300 mm or more. In some instances substrates having diameters of 450 mm or more may be desirable.

In phase 12 of a method according to the current disclosure, a recess is filled with inhibition material.

Deposition of inhibition material 12 may comprise a vapor deposition process. Further, deposition of a layer at phase 14 of FIG. 1A may comprise a vapor deposition process. Deposition of inhibition material 12 may comprise a cyclic vapor deposition process. Deposition of a layer 14 may comprise a cyclic vapor deposition process. As used herein, the term "cyclic deposition" may refer to the sequential introduction of precursors (reactants) into a reaction chamber to deposit material and/or a layer over a substrate, and includes processing techniques such as atomic layer deposition and cyclical chemical vapor deposition.

At phase 12 if FIG. 1A, inhibition material is deposited on the substrate to fill a recess by, for example, a vapor deposition process. The vapor deposition process for depositing inhibition material may be a cyclic process. In some embodiments, the cyclic vapor deposition process for depositing inhibition material comprises supplying at least two precursors in an alternating and sequential manner into a reaction chamber. In some embodiments, the vapor deposition process for depositing inhibition material is a thermal process. In some embodiments, the vapor deposition process for depositing inhibition material is a plasma-free process. In some embodiments, the vapor deposition process for depositing inhibition material is an ALD process. In some embodiments, the vapor deposition process for depositing inhibition material is a CVD process.

CVD-type processes typically involve gas phase reactions between two or more precursors or reactants. The precursors or reactants can be provided simultaneously to the reaction chamber or substrate, or in partially or completely separated pulses. The substrate and/or reaction space can be heated to promote the reaction between the gaseous precursors. In some embodiments the precursors are provided until material having a desired thickness is deposited. Thus, a CVD-type process may be a cyclical process or a non-cyclical process. In some embodiments cyclical CVD-type processes can be used with multiple cycles to deposit material having a desired thickness. In cyclical CVD-type processes, the precursors may be provided to the reaction chamber in pulses that do not overlap, or that partially or completely overlap.

ALD-type processes are based on controlled, typically self-limiting surface reactions of the precursor and/or reactant chemicals. Gas phase reactions are avoided by feeding the precursors alternately and sequentially into the reaction chamber. Vapor phase precursors are separated from each other in the reaction chamber, for example, by removing excess precursors and/or precursor by-products from the reaction chamber between precursor pulses. This may be accomplished with an evacuation step and/or with an inactive gas pulse or purge. In some embodiments the substrate is contacted with a purge gas, such as an inactive gas. For example, the substrate may be contacted with a purge gas between precursor pulses to remove excess precursor and reaction by-products. In some embodiments each reaction is self-limiting and monolayer by monolayer growth is achieved. These may be referred to as "true ALD" reactions. In some such embodiments a first precursor may adsorb on the substrate surface in a self-limiting manner. A second precursor or a reactant, and optional further reactants or precursors will react in turn with the adsorbed first precursor to form up to a monolayer of a target compound on the substrate.

The terms "precursor" and "reactant" can refer to molecules (compounds or molecules comprising a single element) that participate in a chemical reaction that produces another compound, and the terms are used interchangeably in the current disclosure. A precursor typically contains portions that are at least partly incorporated into the compound or element resulting from the chemical reaction in question. Such a resulting compound or element may be deposited on a substrate. A reactant may be an element or a compound that is not incorporated into the resulting compound or element to a significant extent. However, a reactant may also contribute to the resulting compound or element in certain embodiments.

As depicted in phase 12 of FIG. 1A, in the method according to the current disclosure, inhibition material is deposited on the substrate to fill a recess. In some embodiments, inhibition material comprises organic material. In some embodiments, organic material comprises a polymer. In some embodiments the organic inhibition material comprises, consists essentially of, or consists of polyamide and polyimide. In some embodiments the organic inhibition material comprises, consists essentially of, or consists of polyamide or polyimide. In some embodiments, the polymer deposited is a polyimide. In some embodiments, the polymer deposited is a polyamide. Other examples of deposited polymers include dimers, trimers, polyurethanes, polythioureas, polyesters, polyimines, and other polymeric forms or mixtures of the above materials. The term dielectric is used in the description herein for the sake of simplicity in distinguishing from the other surface, namely the metal or metallic surface. It will be understood by the skilled artisan that not all non-conducting surfaces are dielectric surfaces. For example, the metal or metallic surface may comprise an oxidized metal surface that is electrically non-conducting or has a very high resistivity. Selective deposition processes taught herein can deposit on such non-conductive metallic surfaces with minimal deposition on adjacent dielectric surfaces.

Vapor deposition processes can be applied to organic material and polymers such as polyimide, polyamide, polyurea, polyurethane, polythiophene, and more. Cyclic deposition processes of polymers may produce high growth rates and be thus well suited for depositing inhibition material. A process for depositing organic inhibition material on a substrate comprising a structure may comprise one or more deposition cycles comprising contacting the substrate with a first inhibition material precursor, and contacting the substrate with a second inhibition material precursor. The first and the second inhibition material precursors may be in vapor phase. In other words, the deposition of an inhibition material may be a vapor deposition process. Contacting the substrate with the first and second inhibition material precursors forms organic material on the substrate. In some embodiments processes may further comprise repeating the contacting steps until a recess on the substrate has been filled. Without limiting the current disclosure to any specific theory, the organic material may form a layer when only a few nanometers of the material are deposited on the substrate. However, when deposition is continued, the inhibition material may begin to accumulate to the lower parts of a recess to a greater extent than closer to the recess opening, or on the upper surface of the substrate.

In some embodiments organic inhibition material may comprise polyimide. In some embodiments, the substrate may be contacted with the second inhibition material precursor before the substrate is contacted with the first inhibition material precursor. Various precursors can be used for depositing inhibition material. For example, in some embodiments, the first inhibition material precursor comprises a monomer with two reactive groups. In some embodiments, the first inhibition material precursor comprises a diamine and/or a triamine. In some embodiments the substrate is contacted with the first inhibition material precursor comprising a diamine before the substrate is contacted with another, different precursor. In some embodiments the first inhibition material precursor comprises 1,6-diamnohexane (DAH). In some embodiments, one of the inhibition material precursors is, for example, diethylene triamine, pentane 1,3,5 triamine, butane 1,2,4 triamine, and phenyl triamine.

In some embodiments, the second inhibition material precursor comprises an anhydride. In some embodiments the second inhibition material precursor comprises a dianhydride. In some embodiments the second inhibition material precursor comprises pyromellitic dianhydride (PMDA). In some embodiments, the second reactant or precursor is also an organic reactant capable of reacting with adsorbed species of the first reactant under the deposition conditions. In some embodiments, the second inhibition material precursor comprises furan-2,5-dione (maleic acid anhydride). In some embodiments, the second inhibition material precursor comprises a monomer with two reactive groups which will react with the first reactant.

In some embodiments, the substrate is contacted with the first inhibition material precursor prior to being contacted with the second inhibition material precursor. Thus, in some embodiments, the substrate is contacted with an amine, such as a diamine, for example 1,6-diamnohexane (DAH), prior to being contacted with another precursor. However, in some embodiments the substrate may be contacted with the second inhibition material precursor prior to being contacted with the first inhibition material precursor. Thus, in some embodiments the substrate is contacted with an anhydride, such as furan-2,5-dione (maleic acid anhydride), or more particularly a dianhydride, e.g., pyromellitic dianhydride (PMDA) prior to being contacted with another precursor.

In some embodiments, a deposition of an inhibition material may begin with contacting the substrate with the first inhibition material precursor; in other embodiments a process may begin with contacting the substrate with the second inhibition material precursor.

In some embodiments, different reactants can be used to tune the film properties. For example, a polyimide material could be deposited using 4,4'-oxydianiline or 1,4-diaminobenzene instead of 1,6-diaminohexane to get a more rigid structure with more aromaticity and increased dry etch resistance.

In some embodiments the inhibition material precursors do not contain metal atoms. In some embodiments the inhibition material precursors do not contain semimetal atoms. In some embodiments one of the inhibition material precursors comprises metal or semimetal atoms. In some embodiments the inhibition material precursors contain carbon and hydrogen and one or more of the following elements: N, O, S, P or a halide, such as Cl or F. In some embodiments the first inhibition material precursor may comprise, for example, adipoyl chloride (AC).

Deposition conditions can differ depending upon the selected reactants and can be optimized upon selection. In some embodiments the reaction temperature can be selected from the range of about 80° C. to about 250° C. In some embodiments, for example where the inhibition material comprises polyimide, the reaction temperature can be selected from the range of about 170° C. to about 210° C. In some embodiments, for example where the deposited inhibition material comprises polyamide, the reaction temperature can be selected from a range of about 80° C. to about 150° C. In some embodiments where the deposited inhibition material comprises polyimide, the reaction temperature may be greater than about 160° C., 180° C., 190° C., 200° C., or 210° C. In some embodiments where the inhibition material comprises polyamide, the reaction temperature may be greater than about 80° C., 90° C., 100° C., 110° C., 120° C., 130° C., 140° C., or 150° C. In some embodiments the substrate is held at a temperature of greater than about 170° C. during the one or more deposition cycles of depositing inhibition material. In some embodiments, the reaction chamber pressure may be from about 1 mTorr to about 100 Torr, or from about 1 mTorr to about 300 Torr during deposition of inhibition material.

In some embodiments the inhibition material comprises polyamide. In some embodiments the first inhibition material precursor comprises a halogen. In some embodiments the first inhibition material precursor comprises adipoyl chloride (AC). In some embodiments the second inhibition material precursor comprises a diamine. In some embodiments the substrate is held at a temperature of greater than about 80° C. during the one or more deposition cycles of depositing inhibition material.

In some embodiments the first and/or second inhibition material precursor exposure period is from about 0.01 seconds to about 60 seconds, from about 0.05 seconds to about 30 seconds, from about 0.1 seconds to about 10 seconds or from about 0.2 seconds to about 5 seconds. The optimum exposure period can be determined for each specific process. In some embodiments where batch reactors may be used, exposure periods of greater than 60 seconds may be employed.

Cyclic deposition may be repeated, for example from about 100 to about 2,000, or from about 200 to about 2,000, or from about 500 to about 2,000, or from about 1,000 to about 2,000 times to deposit a suitable amount of inhibition material.

Excess of the first inhibition material precursor (and any volatile reaction by-products) may then be removed from contact with the substrate before contacting the substrate with the second inhibition material precursor. In cyclic deposition processes, and depending on the order of exposure of the substrate, excess of the second inhibition material precursor (and any volatile reaction by-products) may then be removed from contact with the substrate before contacting the substrate with the first inhibition material precursor. Such removal can be accomplished by, for example, purging, pumping down, moving the substrate away from a chamber or zone in which it is exposed to the first reactant, or combinations thereof. In some embodiments a first precursor removal period, for example a purge period, is from about 0.01 seconds to about 60 seconds, about 0.05 seconds to about 30 seconds, about 0.1 seconds to about 10 seconds or about 0.2 seconds to about 5 seconds. In some embodiments where batch reactors may be used, removal periods of greater than 60 seconds may be employed.

In the methods according to the current disclosure, inhibition material is deposited on a substrate to fill a recess in the substrate.

In some embodiments, inhibition material deposition may comprise depositing polyamide in a recess of a substrate. In some embodiments depositing polyamide comprises a vapor deposition process. In some embodiments depositing polyamide comprises molecular layer deposition (MLD) process. In some embodiments, depositing inhibition material 12 comprises a CVD process. In some embodiments, depositing a layer 14 comprises a CVD process. In some embodiments, depositing inhibition material 12 comprises an ALD process. In some embodiments, depositing a layer 14 comprises an ALD process.

In phase 12, inhibition material is deposited on the substrate so that is fills a recess. Thus, inhibition material fills at least most of the recess. In some embodiments, the aspect ratio of a recess is reduced. In some embodiments, the recess is completely filled. In some embodiments, the inhibition material is deposited to substantially cover the substrate. In some embodiments, the inhibition material covers the substrate. In some embodiments, the thickness of the inhibition material is at least 0.5 nm at the highest position of the substrate. In some embodiments, the thickness of the inhibition material is at least 1 nm at the highest position of the substrate. In some embodiments, the thickness of the inhibition material is at least 2 nm at the highest position of the substrate. In some embodiments, the thickness of the inhibition material is at least 5 nm at the highest position of the substrate. In some embodiments, the thickness of the inhibition material is at least 10 nm at the highest position of the substrate.

In phase 13 of FIG. 1A, inhibition material according to the current disclosure is removed from the substrate for exposing a first deposition area. This means that the inhibition material is removed from areas on which a layer according to the current disclosure will be deposited at phase 14 of FIG. 1A. Without limiting the current disclosure to any specific theory, it may be that the removal of an inhibition layer, such as an organic layer, may be more practical to regulate than the deposition process thereof. The removal of inhibition material may be adjusted so as to remove the inhibition material only from the top surface of the substrate. Thus, in some embodiments, the inhibition material is removed from areas outside the recess. In some embodiments, the inhibition material is removed substantially or completely from all areas outside the recess. In some embodiments, the inhibition material is removed only from areas outside the recess. In such embodiments, after removal of the inhibition material from predetermined areas of the substrate, the inhibition material surface is flush with the top of the recess, as depicted in more detail in FIGS. 2A and 2B. In such embodiments, the first deposition area covers the topmost areas of the substrate, and the recess surfaces remain covered with inhibition material. Therefore, the layer in question to be deposited at phase 14 of FIG. 1A, will remain only on top of the areas between recesses. However, in some embodiments, inhibition material is removed from the top areas of the substrate, but also from a part of the recess surface. Thus, in such embodiments, the first deposition area is at least partially inside the recess. In other words, the first deposition area extends at least partially inside the recess. The first deposition area may be at least partially on the side walls inside the recess. In such embodiments, a layer to be deposited at phase 14 will be deposited on the tops of the areas between recesses, but the layer will be additionally deposited on the top part of the side walls of the recesses.

In some embodiments, the method comprises removing another part of the inhibition material to expose a second deposition area. In this manner, as explained in more detail in FIG. 2, the structure created by the deposited material may be more flexibly adjusted.

The inhibition material may be removed by various ways. In some embodiments, the part of the inhibition material is removed by etching or ashing. In some embodiments, removal of inhibition material may be isotropic. In some embodiments, removal of inhibition material is anisotropic. In some embodiments, the method according to the current disclosure comprises removing the remaining inhibition material substantially completely and performing an isotropic etching process to modify recess geometry after depositing an etch-stop layer.

In some embodiments, removal of inhibition material 13 may comprise an etch or ashing process known in the art, for example a dry etch process such as a plasma etch process. In some embodiments, removal of inhibition material 13 may comprise exposing the inhibition material to hydrogen atoms, hydrogen radicals, hydrogen plasma, or combinations thereof. For example, in some embodiments removal of inhibition material may comprise exposing the inhibition material to a plasma generated from $H_2$ using a power from about 10 W to about 5,000 W, from about 25 W to about 2,500 W, from about 50 W to about 500 W, from about 100 W to about 400 W, from about 100 W to about 2,500 W, from about 50 W to about 2,000 W or from about 100 W to about 1000 W.

In some embodiments, removing inhibition material may comprise exposing the inhibition material to a plasma. In some embodiments, the plasma may comprise oxygen atoms, oxygen radicals, oxygen plasma, or combinations thereof. In some embodiments, the plasma may comprise hydrogen atoms, hydrogen radicals, hydrogen plasma, or combinations thereof. In some embodiments, the plasma may also comprise noble gas species, for example Ar or He species. In some embodiments, the plasma may consist essentially of noble gas species. In some instances, the plasma may comprise other species, for example nitrogen atoms, nitrogen radicals, nitrogen plasma, or combinations thereof. In some embodiments, removal of inhibition material may comprise exposing the inhibition material to an etchant comprising oxygen, for example $O_3$. ($O_3/N_2$). In some embodiments, the inhibition material may be exposed to an etchant at a temperature of between about 30° C. and about 500° C., or between about 100° C. and about 400° C., or between about 125° C. and about 300° C., or between about 125° C. and about 200° C., or between about 70° C. and about 200° C.

In some embodiments, the etchant may be supplied in one continuous pulse. In some embodiments, the etchant may be supplied in multiple shorter pulses. In some embodiments, removal of inhibition material may be performed at a rate of about 0.5 nm/min to about 50.0 nm/min. In some embodiments, removal of inhibition material may be performed at a rate of about 1 nm/min to about 50.0 nm/min. In some embodiments, removal of inhibition material may be performed at a rate of about 2 nm/min to about 50 nm/min.

In some embodiments for single wafer or small batch (e.g., 5 wafers or less) processing, a low $O_3$ concentration etch process may be used, wherein the low $O_3$ concentration etch process is performed from about 0.01 Torr to 200 Torr, or from about 0.1 Torr to 100 Torr (e.g., 2 Torr). Etchant pulsing can be between 0.01 seconds and 20 seconds, or between 0.05 sec and 10 sec, or between 0.1 sec and 2 seconds (e.g., 0.5 sec pulse/0.5 sec purge of $O_3$). $O_3$ flow can range from 0.01 slm to 2 slm, or from 0.01 slm to 1 slm, or from 0.01 slm to 0.250 slm. Inert (e.g., $N_2$) carrier gas flow of can range from 0.1 slm to 20 slm, or from 0.5 slm to 5 slm (e.g., 1.2 slm). In some embodiments, a high $O_3$ concentration etch process may be used, wherein the high $O_3$ concentration etch process is performed at 1-100 Torr, or at 5-20 Torr (e.g., 9 Torr), with longer exposures per cycle. For example, $O_3$ exposure times can be between 0.1 sec and 20 sec, more particularly between 0.5 sec and 5 sec (e.g., 1 sec pulse/1 sec purge of (3). $O_3$ flow for such high $O_3$ concentration processes can be, for example between 0.1 slm and 4.0 slm, or between 0.5 slm and 4.0 slm, with an inert (e.g., $N_2$) dilution now of 0.1 slm to 20 slm, more particularly 0.5 slm to 5 slm (e.g., 1.2 slm).

At phase 14 of FIG. 1A, a layer is deposited on the first deposition area by a selective vapor deposition process. The selective vapor deposition process for depositing a layer may be a cyclic process. In some embodiments, the cyclic vapor deposition process for depositing a layer comprises supplying at least two precursors in an alternating and sequential manner into a reaction chamber. In some embodiments, the selective vapor deposition process for depositing a layer is a thermal process. In some embodiments, the selective vapor deposition process for depositing a layer is a plasma-free process. In some embodiments, the selective vapor deposition process for depositing a layer is an ALD process. In some embodiments, the selective vapor deposition process for depositing a layer is a CVD process. More than one layer may be deposited at phase 14.

In some embodiments, the inhibition material inhibits depositing a layer thereon with the selective vapor deposition process. Thus, the layer deposited at phase 14 is selectively deposited over the first deposition area relative to the inhibition area. Selectivity may be complete or partial. Selectivity can be given as a percentage calculated by [(deposition on first deposition area)−(deposition on inhibition material)]/(deposition on the first deposition area). Deposition can be measured in any of a variety of ways. In some embodiments deposition may be given as the measured thickness of the deposited material. In some embodiments deposition may be given as the measured amount of material deposited.

In some embodiments selectivity is greater than about 20%, greater than about 50%, greater than about 75%, greater than about 85%, greater than about 90%, greater than about 93%, greater than about 95%, greater than about 98%, greater than about 99% or even greater than about 99.5%. In embodiments described herein, selectivity can change over the duration or thickness of a deposition.

The layer deposited at phase 14 may be a functional layer of a semiconductor device. In some embodiments, the deposited layer is a sacrificial layer. In some embodiments, the deposited layer is an etch-stop layer. An etch-stop layer may comprise aluminum oxide. As used herein, the term "layer" and/or "film" can refer to any continuous or non-continuous structure and material. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

A layer according to the current disclosure may comprise various materials. In some embodiments, the deposited layer comprises, consists essentially of, or consists of a dielectric material. In some embodiments, the deposited layer comprises, consists essentially of, or consists of a metal oxide. In some embodiments, the deposited layer comprises, consists essentially of, or consists of aluminum oxide (such as $Al_2O_3$). In some embodiments, the deposited layer comprises, consists essentially of, or consists of zirconium oxide (such as $ZrO_2$). In some embodiments, the deposited layer comprises, consists essentially of, or consists of titanium oxide (such as $TiO_2$). In some embodiments, the deposited layer comprises, consists essentially of, or consists of a metal nitride. In some embodiments, the deposited layer comprises, consists essentially of, or consists of a titanium nitride (such as TiN).

In some embodiments, the deposited layer comprises silicon. In some embodiments, the deposited layer comprises, consists essentially of, or consists of silicon oxide (such as $SiO_2$). The silicon-containing layer may comprise substantially only silicon oxide, such as $SiO_2$. The silicon-containing material may comprise boron-doped silicon oxide, phosphorus-doped silicon oxide, silicon, poly-silicon, silicon carbides, and silicon nitrides.

In some embodiments, the deposited layer comprises, consists essentially of, or consists of a metal. In some embodiments, the deposited layer comprises, consists essentially of, or consists of an elemental metal. In some embodiments, the deposited layer comprises, consists essentially of, or consists of a metal alloy.

After phase 14, the inhibition material may be completely removed (not shown). Alternatively, additional layers may be deposited over the layer deposited at phase 14 before removal of the inhibition material.

In some embodiments, additional treatments, such as heat or chemical treatment, can be conducted prior to, after or between the foregoing processes. For example, treatments may modify the surfaces or remove portions of the metal, silicon oxide, polymer passivation and metal oxide surfaces exposed at various stages of the process. In some embodiments, the substrate may be pretreated or cleaned prior to or at the beginning of the method according to the current disclosure. In some embodiments, the substrate may be subjected to a plasma cleaning process prior to or at the beginning of the method according to the current disclosure. In some embodiments, the substrate surface may be exposed to hydrogen plasma, radicals, or atomic species prior to or at the beginning of the process according to the current disclosure. In some embodiments, a pretreatment or cleaning process may be carried out in the same reaction chamber as the main process. However, in some embodiments, a pretreatment or cleaning process may be carried out in a separate reaction chamber.

FIG. 1B depicts another embodiment according to the current disclosure. Phases 11 to 14 are performed in the same manner as in the embodiment of FIG. 1A. However, in the embodiment of FIG. 1B, phase 14 of depositing a layer on a first deposition area is followed by a repetition 15 of phase 13. In such embodiments, it is possible to gradually expand the first deposition area, and, for example, deposit different layers on different parts of the first deposition area. Although not depicted in FIG. 1B, it may also be possible to repeat filling of a recess. In other words, phases 12, 13 and 14 could all be repeated. In some embodiments, phases 13 and 14 are repeated once. In some embodiments, phases 13 and 14 are repeated twice. In some embodiments, phases 13 and 14 are repeated three times or more.

FIG. 2A is an illustration of a method according to the current disclosure in a schematic manner. Pane I depicts a substrate (hatched) 20 with a recess 21. The substrate has been drawn as comprising uniform material, but in some embodiments, the substrate 20 may comprise more than one material. In some embodiments, the substrate may comprise areas comprising materials that differ from each other. In panel II the recess 21 has been filled with inhibition material

22 (gray area). The inhibition material has completely filled the recess 21 and forms an even surface on the substrate. In panel III, the inhibition material 22 has been removed from the surface of the substrate 20, and the inhibition material 22 is left only inside the recess. The surface of the inhibition material is flush with the top part of the substrate, forming a first deposition area 23 on the top of the substrate 20. Thus, in panel IV, a layer 24 (black) is deposited only on the top areas of the substrate 20. The deposition has been selective on the substrate 20 relative to the inhibition material 22, so that the inhibition material is substantially free of the deposited layer 24. In some embodiments, selective deposition of a layer 24 may advantageously contain also etch back steps to avoid layer 24 growth on the inhibition material.

In panel V, the inhibition material 22 has been completely removed. The substrate can undergo further processing, such as the deposition of additional layers.

FIG. 2B is an illustration of another embodiment of a method according to the current disclosure in a schematic manner. Panels I and II have been omitted for simplicity, since they are identical to FIG. 2A. The two embodiments differ at panel III. In the embodiment of FIG. 2B, inhibition material 22 has been removed also from the top portion of the recess 21. Thus, in this embodiment, the first deposition area 23 covers the top part of the substrate 20 and the recess surface extending until the inhibition material 22. Panel IV indicates the deposited layer 24 extends into recess 21. Panel V displays the layer and the substrate with the recess after removal of the inhibition material 22.

FIG. 2B contains an additional panel VI depicting an embodiment independent of panels III to V of FIG. 2B. In the embodiment of panel VI, the recess 21 geometry is modified after the removal of the inhibition material 22. The deposited layer 24 is an etch stop layer. An isotropic etching has been performed after the deposition of the etch stop layer 24 in order to create an undercut 211 into the recess 21 below the deposited layer 24. The etch stop layer may be later removed, or it may remain in the final device.

FIG. 2C is an illustration of yet another embodiment of a method according to the current disclosure in a schematic manner. Although illustrated in a slightly different form, the schematic drawings of panels I to IV correspond to those of FIG. 2A. Thus, panel I depicts a substrate 20 with a recess 21, and panel II depicts a substrate covered with inhibition material 22. In panel III, the first deposition area 23 has been revealed by removing the inhibition material 22 from the substrate 20 (the predetermined area being the topmost area of the substrate 20). In panel IV, a layer 24 has been deposited on the first deposition area 23.

In the embodiment of FIG. 2C, the phase of removing inhibition material is repeated, i.e., performed a second time after a layer 24 has been deposited, as depicted in panel V. This embodiment thus differs from the previous ones in that the removal of the inhibition material is not complete. Instead, the inhibition material is removed from a second predetermined area 25. Panel VII depicts the situation after a second layer deposition has been performed. The second layer 26 (dotted) covers the second deposition area 25 as well as the previously deposited layer 24. Such embodiments of the method offer, for example, the possibility to deposit two layers of different material, if layers 24 and 26 have a different composition. Even if the materials are the same, this kind of an embodiment offers the possibility to increase the layer thickness at the top of a structure, since the side walls are only covered with layer 26, whereas the top of the substrate is covered by both layers 24 and 26. As a further embodiment (not shown), it is possible to deposit already the first layer 24 as extending into the recess 21. In other words, the first layer 24 is not limited to being located only on the top of the substrate.

Panel VIII depicts the substrate with the layers 24 and 26 after the complete removal of the inhibition material 22.

FIG. 2D also contains an additional embodiment of the method according to the current disclosure. In this embodiment, processes depicted in panels I to VII of FIG. 2C apply without change. However, at VII, inhibition material is removed to a larger extent than in the embodiment of FIG. 2C. However, this may not be necessary. Depending on the application, inhibition material may remain as is shown in the embodiment of FIG. 2C. However, in the embodiment of FIG. 2D, layer 26 is grown until an air gap 212 is formed to the lower part of a recess, as depicted in panel IX. In some embodiments, it may be possible to create the air gap 212 also by extending the process of panels I to VIII by continuing to deposit the layer 26 after the removal of the inhibition material 22. The timing of the inhibition material removal relative to the deposition of layer 26 will determine the size and shape of the air gap 212. It is explicitly envisaged that an embodiment with an air gap 212 is possible without the two-stepped removal of the inhibition material depicted in FIG. 2C, but it may be realized also based on the embodiment of FIG. 2B.

In some embodiments of the current disclosure, such as depicted in FIG. 3, the recess 21 comprises a vertical portion and a horizontal portion extending from the vertical portion relative to the substrate surface, and the inhibition material 22 is removed substantially only from the vertical portion of the recess. There may be more than one, such as two, four, six, eight, ten, twelve, fourteen, sixteen, twenty, twenty four or even more horizontally extending portions of the recess 21. The horizontal portions may be arranged symmetrically.

In FIG. 3, panel I depicts a substrate 20 with a recess 21 comprising vertical and horizontal portions. In panel II, the recess 21 has been filled with inhibition material 22. Panel II displays the first deposition area 23 after an anisotropic removal of the inhibition material 22. The first deposition area 23 comprises the substrate surface, as well as the surfaces of the vertical portion of the recess 21. In the embodiment of FIG. 3, the substrate 20 has also been exposed from the bottom of the recess 21. However, the removal of the inhibition material 22 may be regulated so that the bottom of the recess 21 comprises inhibition material 22, in which case there would be no deposition of a layer 24 at the bottom of the recess 21. Inhibition material 22 remains in the horizontal portions of the recess 21. In panel IV, a layer 24 has been selectively deposited on the substrate surface relative to the inhibition material 22, so that after the inhibition material 22 has been removed, only first deposition area 23 contains a layer 24, as shown in panel V.

Figure 4:
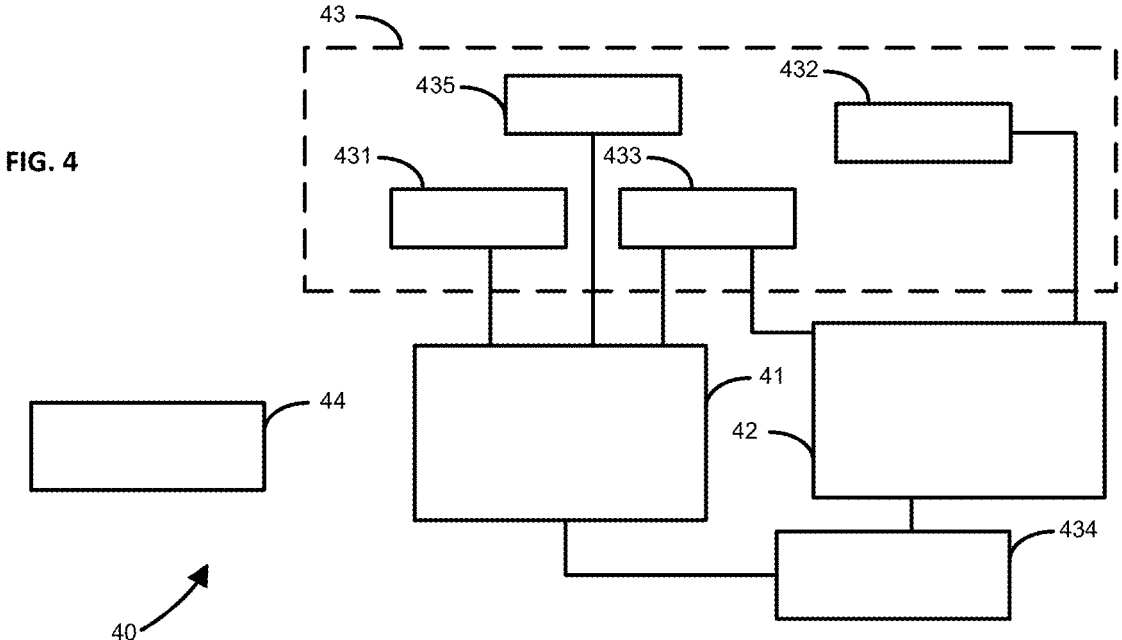
FIG. 4 depicts a vapor deposition assembly according to the current disclosure in a schematic form.

FIG. 4 is a schematic presentation of a vapor deposition assembly according to the current disclosure. The vapor deposition assembly 40 for depositing a layer on a substrate comprising a recess comprises a first reaction chamber 41 configured and arranged to deposit an inhibition material on the substrate for filling the recess, and to remove the inhibition material from the substrate for exposing a first deposition area. The vapor deposition assembly 40 comprises a second reaction chamber 42 configured and arranged to deposit a layer on the first deposition area by a selective vapor deposition process. In some embodiments, the second reaction chamber is a second deposition chamber inside a multi-station deposition chamber. In some embodiments, the vapor deposition assembly 40 is a cluster tool. In some embodiments, the vapor deposition assembly 40 is a single wafer deposition tool. In some embodiments, the vapor deposition assembly 40 is a batch-processing tool. Deposition assembly 40 can be used to perform a method as described herein.

The vapor deposition assembly may be constructed and arranged to provide inhibition material precursor via the precursor injector system to a reaction chamber, to remove the inhibition material from the substrate by the inhibition material removal system and to provide the layer precursor via the precursor injector system to the reaction chamber for depositing a layer on the first deposition area of the substrate.

In the illustrated example, deposition assembly 40 includes two reaction chambers 41 and/or 42, a precursor injector system 43, at least one inhibition material precursor vessel 431, at least one layer precursor vessel 432 for depositing a layer, a purge gas source 433, an exhaust source 434, and a controller 44. The one or more inhibition material precursor vessels 431 may be constructed and arranged for holding and vaporizing an inhibition material precursor to form an inhibition material precursor vapor. The one or more layer precursor vessels 432 may be constructed and arranged to contain and evaporate a layer precursor to provide a layer precursor into the reaction chamber in a vapor phase. The precursor injector system 43 may be constructed and arranged to provide an inhibition material precursor into a reaction chamber in a vapor phase, and to provide a reactant into a reaction chamber in a vapor phase.

The vapor deposition assembly 40 further comprises an inhibition material removal system 435. Such a system may comprise an $O_3$ generator or a plasma generation system, for example, depending on the specific application in question. The inhibition material removal system 435 may be configured and arranged to remove the inhibition material from the substrate for exposing a first deposition area.

Purge gas source 433 can include one or more inert gases. Although illustrated with two precursor vessels 431 and 432, the deposition assembly 40 can include any suitable number of precursor vessels. Precursor vessels 431 and 432 can be coupled to their respective reaction chambers 41 and/or 42 via gas lines, which can each include flow controllers, valves, heaters, and the like.

Exhaust source 434 can include one or more vacuum pumps.

Controller 44 includes electronic circuitry and software to selectively operate valves, manifolds, heaters, pumps and other components included in the deposition assembly 40. Such circuitry and components operate to introduce precursors, reactants and purge gases from the respective precursor vessels 431 and 432. Controller 44 can control timing of gas pulse sequences, temperature of the substrate and/or reaction chambers 41 and/or 42, pressure within the reaction chambers 41 and/or 42, and various other operations to provide proper operation of the deposition assembly 40. Controller 44 can include control software to electrically or pneumatically control valves to control flow of precursors, reactants and purge gases into and out of the reaction chambers 41 and/or 42. Controller 44 can include modules such as a software or hardware component, which performs certain tasks. A module may be configured to reside on the addressable storage medium of the control system and be configured to execute one or more processes.

Other configurations of deposition assembly 40 are possible, including different numbers and kinds of precursor sources and purge gas sources. Especially in some embodiments, the deposition of the inhibition material and its removal may be arranged to be performed in separate reaction chambers. In such embodiments, the vapor deposition assembly may comprise three reaction chambers. Further, it will be appreciated that there are many arrangements of valves, conduits, precursor sources, and purge gas sources that may be used to accomplish the goal of selectively and in a coordinated manner feeding gases into reaction chambers 41 and/or 42. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 40, substrate(s), such as semiconductor wafers (not illustrated), are transferred from, e.g., a substrate handling system to reaction chamber 41 and/or 42. Once the substrate(s) are transferred to reaction chambers 41 and/or 42, one or more gases from gas sources 431, 432, and 433 may be provided to perform the method according to the current disclosure. The substrate(s) may be transferred between reaction chambers 41 and 42 as needed in the performance of the current methods.

In an additional aspect, the current disclosure relates to a structure comprising a layer deposited by a method according to the current disclosure. As used herein, a "structure" can be or include a substrate as described herein. Structures can include one or more layers overlying the substrate, such as one or more layers formed by a method according to the current disclosure.

The invention claimed is:

1. A method of depositing one or more layers on a substrate comprising a recess, wherein the method comprises:
depositing an inhibition material on the substrate to fill the recess;
removing the inhibition material from a top part of the recess; and
depositing, by a selective vapor deposition process, the one or more layers on the substrate where the inhibition material was removed until the one or more layers fill the top part of the recess to form an air gap in a lower part of the recess.

2. The method of claim 1, comprising:
removing, prior to the depositing of the one or more layers, some of the inhibition material from the lower part of the recess where the air gap is formed.

3. The method of claim 1, wherein the depositing of the one or more layers comprises multiple phases of depositing the one or more layers, and wherein the method further comprises:
removing, between the multiple phases, some or all of the inhibition material from the lower part of the recess where the air gap is formed.

4. The method of claim 1, comprising:
removing the inhibition material from a top surface of the substrate outside of the recess prior to the removing of the inhibition material from the top part of the recess; and
depositing one layer of the one or more layers on the top surface where the inhibition material was removed.

5. The method of claim 1, wherein the one or more layers comprises multiple layers, and wherein each of the multiple layers comprises a different material.

6. The method of claim 1, wherein the selective vapor deposition process is a cyclic vapor deposition process.

7. The method of claim 6, wherein the cyclic vapor deposition process comprises supplying at least two precursors in an alternating and sequential manner.

8. The method of claim 1 wherein the inhibition material comprises organic material.

9. The method of claim 8, wherein the organic material comprises a polymer or polyimide.

10. The method of claim 1, wherein the inhibition material inhibits the selective vapor deposition process from depositing the one or more layers on the substrate.

11. A method of deposition of layers on a substrate comprising a recess filled with an inhibition material, wherein the method comprises:
removing a portion of the inhibition material from the substrate to expose a first deposition area;
depositing a first layer on the first deposition area by a selective vapor deposition process;
removing, after the depositing of the first layer, an additional portion of the inhibition material to expose a second deposition area in a top part of the recess; and
depositing a second layer on the second deposition area to form an air gap in a lower part of the recess covered by the second layer.

12. The method of claim 11, further comprising:
depositing the second layer on the first layer, wherein the first layer and the second layer comprise different materials.

13. The method of claim 11, wherein the first deposition area and the first layer extend into the recess, and the second layer is deposited over the first layer.

14. The method of claim 11, comprising:
removing, prior to the depositing of the second layer, some of the inhibition material from the lower part of the recess where the air gap is formed.

15. The method of claim 11, wherein the depositing of the second layer comprises:
depositing an initial portion of the second layer;
removing, after the depositing of the initial portion of the second layer, a remaining portion of the inhibition material from the lower part of the recess where the air gap is formed; and
depositing a remaining portion of the second layer after the removing of the remaining portion of the inhibition material.

16. The method of claim 11, wherein the selective vapor deposition process is a cyclic vapor deposition process that comprises supplying at least two precursors in an alternating and sequential manner.

17. The method of claim 11, wherein:
the removing of the portion of the inhibition material from the substrate to expose the first deposition area is performed in a first reaction chamber; and
the depositing of the first layer on the first deposition area is performed in a second reaction chamber.

18. A vapor deposition assembly for depositing a layer on a substrate comprising a recess, the vapor deposition assembly comprising:
a first chamber configured and arranged to deposit an inhibition material on the substrate to fill the recess, and to remove the inhibition material from a top part of the recess; and
a second chamber configured and arranged to deposit, by a selective vapor deposition process, one or more layers on the substrate where the inhibition material was removed until the one or more layers fill the top part of the recess to form an air gap in a lower part of the recess.

19. The vapor deposition assembly of claim 18, wherein the vapor deposition assembly is a cluster tool.

20. The vapor deposition assembly of claim 18, further comprising:

an inhibition material precursor vessel coupled to the first chamber;

a layer precursor vessel coupled to the second chamber; and a controller configured to control flow of precursors from the inhibition material precursor vessel and the layer precursor vessel into the first chamber and the second chamber, respectively.

\* \* \* \* \*